(12) United States Patent
Kubota

(10) Patent No.: US 7,599,416 B2
(45) Date of Patent: Oct. 6, 2009

(54) LASER DIODE DRIVING CIRCUIT

(75) Inventor: Shinichi Kubota, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 17 days.

(21) Appl. No.: 12/076,518

(22) Filed: Mar. 19, 2008

(65) Prior Publication Data

US 2008/0181273 A1    Jul. 31, 2008

Related U.S. Application Data

(62) Division of application No. 10/947,377, filed on Sep. 23, 2004, now Pat. No. 7,369,590.

(30) Foreign Application Priority Data

Sep. 24, 2003   (JP)   ............................. 2003-331328

(51) Int. Cl.
*H03K 171/78* (2006.01)
(52) U.S. Cl. ..................... 372/38.02; 327/514
(58) Field of Classification Search ............ 372/29.015, 372/29.011, 29.02, 38.01, 38.07, 20, 38.02
See application file for complete search history.

(56) References Cited

U.S. PATENT DOCUMENTS 4,813,046 A * 3/1989 Shimada ..................... 359/197
5,317,578 A * 5/1994 Ogou ..................... 372/29.015
5,517,151 A * 5/1996 Kubota ........................ 327/514
5,815,025 A * 9/1998 Kubota ........................ 327/514

FOREIGN PATENT DOCUMENTS

JP    10-270784    10/1998

* cited by examiner

*Primary Examiner*—Minsun Harvey
*Assistant Examiner*—Tuan N. Nguyen
(74) *Attorney, Agent, or Firm*—Dickstein Shapiro LLP

(57) ABSTRACT

A disclosed laser diode driving circuit causes a laser diode to emit light by varying a current value of a current source in accordance with a control signal input externally and supplying a current that is the same as or proportional to the current value to the laser diode. The driving circuit includes correction circuitry for generating a reference forward voltage as a reference for the laser diode in accordance with a predetermined driving current for driving the laser diode, generating a forward voltage for the laser diode in accordance with the predetermined driving current, and correcting a current supplied to the laser diode so that the forward voltage becomes the same as the reference forward voltage.

21 Claims, 10 Drawing Sheets

LASER DIODE DRIVING CIRCUIT

CROSS REFERENCE TO RELATED APPLICATIONS

This application is a divisional of U.S. application Ser. No. 10/947,377, filed on Sep. 23, 2004 now U.S. Pat. No. 7,369,590, the entire disclosure of which is hereby incorporated by reference.

BACKGROUND OF THE INVENTION

1. Field of the Invention

The present invention generally relates to laser diode driving circuits, and particularly relates to a laser diode driving circuit which can precisely control a driving current for a laser diode used in printers, optical disk apparatuses, optical communication systems, etc.

2. Description of the Related Art

Semiconductor diodes are small sized and less expensive devices which can easily emit laser light by only receiving electric currents, and therefore are widely utilized in the fields of printers, optical disk apparatuses, optical communication systems, etc.

FIG. 12 shows a circuit diagram of a prior art laser diode driving circuit.

In FIG. 12, a laser diode driving circuit 100 includes a current source 101 and a current mirror circuit 104. The current source 101 changes its output current according to an input control signal SCa. The current mirror circuit 104 is formed by N-channel type MOSFETs (referred to as "NMOS transistor" hereinafter) 102 and 103 which receive a current ia from the current source 101. The laser diode driving circuit 100 further includes a current mirror circuit 107, which is formed by P-channel type MOSFETs (referred to as "PMOS transistor" hereinafter) 105 and 106 receiving an output current ib from the current mirror circuit 104. A laser diode LD is connected between a drain of the PMOS transistor 106 in the current mirror circuit 107 and a negative power supply Vss. A switch 108 is provided between a drain of the NMOS transistor 103 in the current mirror circuit 104 and a drain of the PMOS transistor 105 in the current mirror circuit 107.

In response to the control signal Sca, the current ia output from the current source 101 is mirrored by the current mirror circuit 104 and input to the current mirror circuit 107, and finally becomes a drain current for the PMOS transistor 106 in the current mirror circuit 107. The drain current from the PMOS transistor 106 is supplied as a driving current iLD to the laser diode LD, which responds to the current and emits light. The magnitude of the optical output from the laser diode LD is determined by the output current ia output from the current source 101 in response to the control signal SCa. The switch 108 is controlled by a control signal output from a controlling circuit (not shown) and controls the on and off of the laser diode LD.

There exists another prior art laser diode driving circuit which is inserted serially to a transistor controlling a current of the LD driving current, and stabilizes an optical output and lowers a power supply voltage by omitting a resistor detecting the LD driving current variation, as shown in Japanese Patent Laid-open Publication 10-270784.

However, in order to equalize an input current and output current of a current mirror circuit, a source-gate voltage Vgs of MOS transistors forming the current mirror must be the same as their source-drain voltage Vds.

FIG. 13 is a graph of an NMOS transistor, in which characteristics between its drain current id and drain voltage Vds are shown with its gate voltage Vgs being a parameter.

As shown in FIG. 13, in the saturated region, the drain current id increases as the drain voltage Vds increases, even if the gate voltage Vgs is constant. This phenomenon is known as a channel length modulation effect.

With reference to the current mirror circuit 107 shown in FIG. 12, the PMOS transistors 105 and 106 forming the current mirror circuit 107 have sources that are both connected to a positive power supply Vdd. Their gates are connected to each other, and therefore their source-gate voltages are the same. However, a drain voltage Vb varies according to the control signal SCa, that is, the current ia from the current source 101. This is because the drain voltage Vb of the PMOS transistor 105 decreases, and the anode voltage VLD of the laser diode LD increases as the driving current iLD of the laser diode LD increases. In a MOS transistor, generally, its source-gate voltage increases as its drain current increases.

While the current ia from the current source 101 is small, that is, in a B zone shown in FIG. 14A, the drain voltage Vb of the PMOS transistor 105 is larger than the drain voltage VLD of the PMOS transistor 106. As the current ia increases, the difference between the drain voltage Vb of the PMOS transistor 105 and the drain voltage VLD of the PMOS transistor 106 decreases. At a point A, the drain voltage VLD starts to exceed the drain voltage Vb.

As shown by a prior art characteristics curve in FIG. 14B, due to the channel length modulation effect, in the B zone where the current ia from the current source 101 is smaller than the current value at the point A, the current iLD supplied to the laser diode LD is larger than the target value. After the current ia goes over the point A and into a C zone, the current iLD becomes smaller than the target value, which is a problem. And also due to power supply variation, the current iLD supplied to the laser diode LD varies. The phenomenon due to the channel length modulation effect or the power supply variation similarly occurs at the current mirror circuit 104.

With reference to FIGS. 15 and 16, it is explained how to determine the currents ia, ib and iLD shown in FIG. 12.

FIG. 15 represents the B zone in FIG. 14 where the output current ia from the current source 101 is small. The current ia from the current source 101 determines an operating point N1 of the NMOS transistor 102. The gate voltage of the NMOS transistor 103 is the same as that of the NMOS transistor 102, but the drain voltage Vb of the NMOS transistor 103 is larger than the gate voltage Va. Therefore, the operation point of the NMOS transistor 103 lies at a point N2 which is shifted to the right from the gate Va. The current at the operating point N2 becomes the drain current ib of the NMOS transistor 103.

The operation point N2 is also an operation point of the PMOS transistor 105. The gate voltage Vb of the PMOS transistor 106 is the same as that of the PMOS transistor 105, but the drain voltage VLD of the PMOS transistor 106 is smaller than the gate voltage vb. Therefore, a point P2 shifted to the left becomes an operating point. The current at the operation point P2 becomes the driving current iLD for the laser diode LD. It is understood from FIG. 15 that the driving current iLD increases compared to the current ia from the current source 101.

Next, FIG. 16 represents the C zone in FIG. 14 where the output current ia from the current source 101 is large. In FIG. 16, the current ia from the current source 101 determines an operating point N1 of the NMOS transistor 102. The gate voltage Va of the NMOS transistor 103 is the same as that of the NMOS transistor 102, but the drain voltage Vb of the NMOS transistor 103 is smaller than the gate voltage Va.

Therefore, the operation point of the NMOS transistor 103 lies at a point N2 which is shifted to the left from the operation point N1. The current at the operating point N2 becomes the drain current ib of the NMOS transistor 103. The operation point N2 is also an operating point of the PMOS transistor 105.

The gate voltage Vb of the PMOS transistor 106 is the same as that of the PMOS transistor 105, but the drain voltage VLD of the PMOS transistor 106 is larger than the gate voltage Vb. Therefore a point P2 shifted to the right becomes an operating point. The current at the operating point P2 becomes the driving current iLD of the laser diode LD. It is understood from FIG. 16 that the driving current iLD decreases comparing to the current ia from the current source 101. Thus, due to the channel length modulation effect, the driving current iLD for the diode LD is shifted from the target current value obtained by the control signal SCa, which is a problem.

SUMMARY OF THE INVENTION

It is a general object of the present invention to provide a laser diode driving circuit which can supply to a laser diode a current close to a target current value, by correcting the difference due to the channel length modulation effect, or power supply variation between the target current value and the actual current value supplied to the laser diode.

DESCRIPTION OF THE PREFERRED EMBODIMENTS

In the following, embodiments of the present invention are described with reference to the accompanying drawings.

First Embodiment

Figure 1:
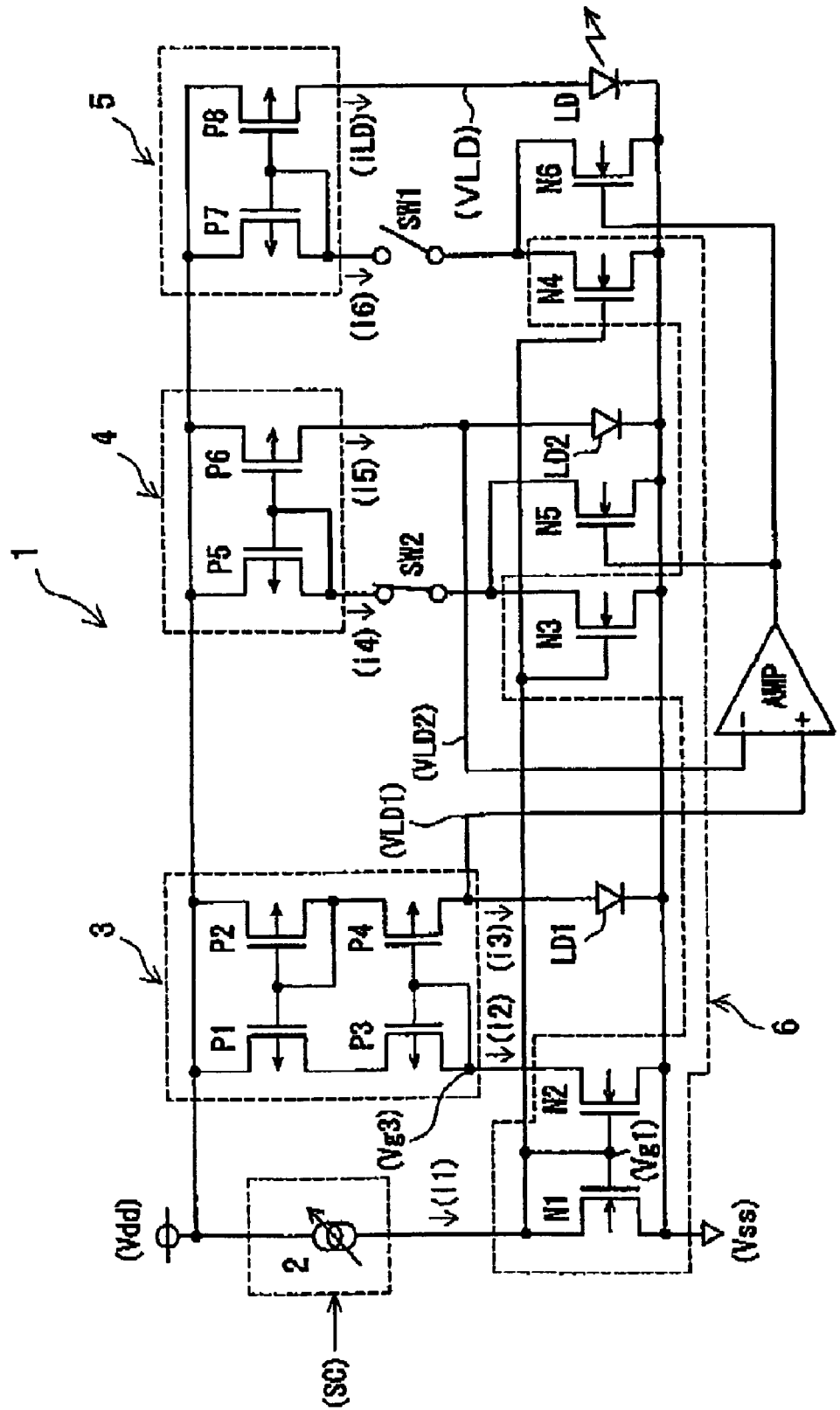
FIG. 1 is a circuit diagram of a laser diode driving circuit according to a first embodiment of the present invention.

FIG. 1 is circuit diagram of a laser diode driving circuit 1 according to a first embodiment of the present invention.

In FIG. 1, the laser diode driving circuit 1 includes a current source 2, a laser diode LD, a first pseudo laser diode LD1 and a second laser diode LD2. An output current it of the current source 2 varies according to an input control signal SC. The laser diode LD receives a current iLD and has an anode voltage VLD that is a forward voltage. Currents supplied to the first and second pseudo laser diode LD1 and LD2 and their anode voltages have characteristics or proportionality similar to that of the current iLD and the anode voltage VLD.

The laser diode driving circuit 1 further includes a highly precise first current mirror circuit 3, a second current mirror circuit 4, a third current mirror circuit 5 and a fourth current mirror circuit 6. The first current mirror circuit 3 supplies a current to the first pseudo laser diode LD1. The second current mirror circuit 4 supplies a current to the second pseudo laser diode LD2. The third current mirror circuit 5 supplies a current to the laser diode LD. The fourth current mirror circuit 6 receives an output current i1 from the current source 2, and supplies currents i2, i4 and i6 to the first mirror circuit 3, the second mirror circuit 4 and the third current mirror circuit 5, respectively.

The laser diode driving circuit 1 further comprises NMOS transistors N5 and N6, an operational amplifier AMP for controlling the operation of NMOS transistors N5 and N6, and first and second switches SW1 and SW2. The first switch SW1 controls the on and off of the laser diode LD, and the second switch SW2 corrects an impedance of the switch SW1 when it turns on. The first and second pseudo laser diodes LD1 and LD2, the first through fourth current mirror circuits 3-6, NMOS transistors N5 and N6, the operational amplifier circuit AMP, and the first and second switches SW1, SW2 constitute correction circuitry. The NMOS transistors N5, N6 and the operational amplifier circuit AMP constitute a correction circuit. The NMOS transistor N5 is an example of the first transistor, and the NMOS transistor N6 is an example of the second transistor.

The first current mirror circuit 3 is a stacked type current mirror circuitry formed by PMOS transistors P1-P4. The second mirror circuit 4 is formed by PMOS transistors P5 and P6. The third current mirror circuit 5 is formed by PMOS transistors P7 and P8. The fourth current mirror circuit 6 is formed by NMOS transistors N1-N4.

Between a positive power supply Vdd and a negative power supply Vss (e.g. ground potential), a current source 2 and an NMOS transistor N1 are serially connected. A gate of the NMOS transistor N1 is connected to its drain. Further, the gate of the NMOS transistor N1 is connected to each of gates of NMOS transistors N2-N4. Sources of the NMOS transistors N1-N4 are connected to the negative power supply Vss.

In the current mirror circuit 3, between the positive power supply Vdd and the drain of the NMOS transistor N2, the PMOS transistors P1 and P3 are serially connected. Between the positive power supply Vdd and an anode of the pseudo laser diode LD1, PMOS transistors P2 and P4 are serially connected. A cathode of the first pseudo laser diode LD1 is connected to the negative power supply Vss. Gates of the PMOS transistors P1 and P2 are connected together, and the connecting node is connected to the drain of the PMOS transistor P2. Gates of the PMOS transistors P3 and P4 are connected together, and the connecting point is connected to the drain of the PMOS transistor P3.

In the second current mirror circuitry 4, sources of the PMOS transistors P5 and P6 are connected to the positive power supply Vdd, their gates are connected together and the connecting node is connected to the drain of the PMOS transistor P5. Between the drain of the PMOS transistor P5 and the negative power supply Vss, the switch SW2 and the NMOS transistor N3 are serially connected. Between the drain of the PMOS transistor P6 and the negative power supply Vss, the second pseudo laser diode LD2 is connected.

In the third current mirror circuitry 5, sources of the PMOS transistors P7 and P8 are connected to the positive power supply Vdd, their gates are connected together, and the connecting node is connected to the drain of the PMOS transistor P7. Between the drain of the PMOS transistor P7 and the negative power supply Vss, the switch SW1 and the NMOS transistor N4 are serially connected. Between the drain of the PMOS transistor P8 and the negative power supply Vss, the laser diode LD is connected.

In the operational amplifier circuit AMP, a non-inverting input terminal is connected to a node between the drain of the PMOS transistor P4 and an anode of the first pseudo laser diode LD1. An inverting input terminal is connected to a node between the drain of the PMOS transistor P6 and an anode of the second pseudo laser diode LD2. An output terminal of the operational amplifier circuit AMP is connected to the gates of the NMOS transistors N5 and N6. The NMOS transistor N5 is connected to the NMOS transistor N3 in parallel. The NMOS transistor N6 is connected to the NMOS transistor N4 in parallel.

Figure 2:
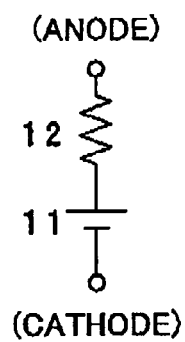
FIG. 2 is an example of each of the first and second pseudo laser diodes LD1, LD2.
Figure 3:
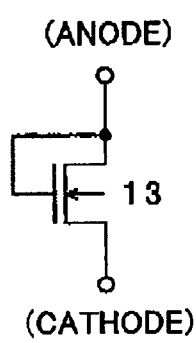
FIG. 3 is another example of each of the first and second pseudo laser diodes LD1, LD2.
Figure 4:
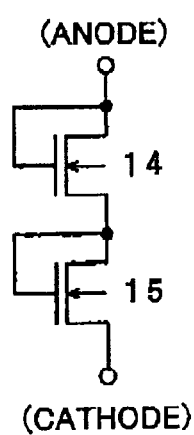
FIG. 4 is further example of each of the first and second pseudo laser diodes LD1, LD2.

The first and second pseudo laser diodes LD1 and LD2 are configured as shown in FIGS. 2-4. They are formed by a constant voltage power supply circuit 11 and a resistor 12 in FIG. 2. They are formed by an NMOS transistor 13 having a gate and drain connected to each other in FIG. 3. They are formed by NMOS transistors 14 and 15 serially connected together in FIG. 4. In the first and second pseudo laser diodes LD1 and LD2, a flowing current and a forward voltage between the anode and cathode are adjusted so as to be the same as or proportional to those of the laser diodes LD.

The second mirror circuit 4 is formed by small sized MOS transistors which are small compared with the third current mirror circuit 5, so as to reduce its consumption current to one tenth to several one-hundredths of an amp. A current ratio of (1) iLD2-VLD2 characteristics between the current iLD2 supplied to the second pseudo laser diode LD2 and an anode forward voltage VLD of the second pseudo laser diode LD2, over (2) iLD-VLD characteristics between the current iLD supplied to the laser diode LD and an anode forward voltage VLD of the laser diode LD2 is adjusted so as to coincide with a ratio of the consumption current M2$i$ of the second current mirror circuit 4 over the consumption current M3$i$ of the third current mirror circuit 5. That is, the size of each transistor in the second current mirror circuit 4 and the third current mirror circuit 5 is adjusted so that iLD2/iLD=M2$i$/M3$i$.

The second switch SW2 connected to the second current mirror circuit 4 is normally on. An impedance Z2 of the second switch SW2 is larger than an impedance Z1 of the first switch SW1 when the switch SW1 connected to the third current mirror circuit 5 is turned on. The impedances Z1 and Z2 of the switches SW1 and SW2 are adjusted so that an impedance ratio Z2/Z1 is equal to the inverse of a ratio of the consumption current M2$i$ of the second current mirror circuit 4 over the consumption current M3$i$ of the third current mirror circuit 5, that is, so that Z2/Z1=M3$i$/M2$i$.

Figure 5:
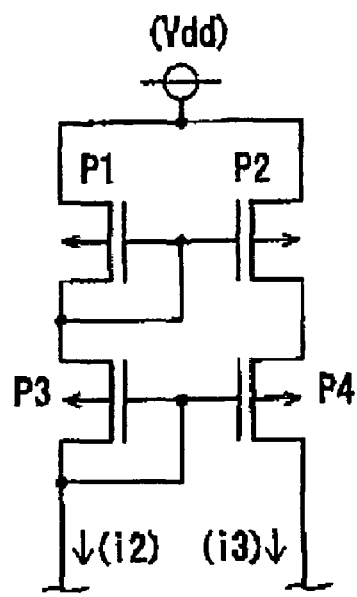
FIG. 5 is an example circuit diagram of the first current mirror circuit.
Figure 6:
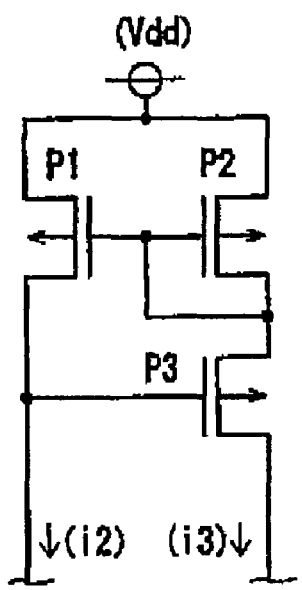
FIG. 6 is another example circuit diagram of the first current mirror circuit.

The first current mirror circuit 3 has a stacked structure as shown in FIG. 1, and therefore can drastically improve the asymmetry due to the channel length modulation effect. Other types of current mirror circuits such as a cascaded type current mirror circuit in which PMOS transistors are cascade-connected as shown in FIG. 5 and a Wilson-type current mirror circuit as shown in FIG. 6 can be used as the first current mirror circuit 3.

In the fourth current mirror circuit 6, the drain of the NMOS transistor N1 is provided with the current i1 from the current source 2. Currents in accordance with the current i1 are output as drain currents for the NMOS transistors N2-N4, and input to the first through third current mirror circuits 3-5, respectively.

In this structure, the current i1 from the current source 2 in accordance with the control signal SC becomes a drain current for the NMOS transistor N1 in the fourth current mirror circuit 6. This current is mirrored by the NMOS transistor N2 and supplied to the first pseudo laser diode LD1 connected to the output terminal of the first current mirror circuit 3. The drain current i1 of the NMOS transistor N1 in the fourth current mirror circuit 6 is mirrored by the NMOS transistor N3, input to the second current mirror circuit 4, and further supplied to the pseudo laser diode LD2 connected to the output terminal of the second current mirror circuit 4.

An element size of the NMOS transistor N2 is arranged to be larger than an element size of the NMOS transistor N3, so that the drain current i2 of the NMOS transistor N2 becomes larger than the drain current i4 of the NMOS transistor N3 having the same gate voltage. As a result, the current iLD1 flowing through the first pseudo laser diode LD1 becomes larger than the current iLD2 flowing through the second pseudo laser diode LD2. Because the current-voltage characteristics of the first pseudo laser diode LD1 and the second laser diode LD2 are the same, the voltage VLD2 of the second pseudo laser diode LD2 becomes smaller than the forward anode voltage VLD1 of the first pseudo laser diode LD1.

The voltage VLD1 of the first pseudo laser diode LD1 is connected to the non-inverting input terminal of the operational amplifier circuit AMP, and the voltage VLD2 of the second pseudo laser diode LD2 is connected to the inverting input terminal of the operational amplifier circuit AMP. Therefore, the operational amplifier circuit AMP controls the gate voltage of the AMOS transistor N5 connected to the output terminal thereof, and increases the input current i4 of the second current mirror circuit 4 to increase the output current i5 of the second current mirror circuit 4 so that the voltage VLD2 of the second pseudo laser diode LD2 becomes equal to the voltage VLD1 of the first pseudo laser diode LD1.

Further, because the gate of the NMOS transistor N6 is connected to the output terminal of the operational amplifier circuit AMP, the input current i6 of the third current mirror circuit 5 is increased. The increment of the current i6 is determined by a drain current ratio of the NMOS transistor N5 and the NMOS transistor N6 when they have the same gate voltage. It is possible to make the drain current ratio the same as the consumption current M2$i$ of the second mirror circuit 4 and the consumption current M3$i$ of the third current mirror circuit 5 and make the current iLD supplied to the laser diode LD proportional to the current iLD2 supplied to the second pseudo laser diode LD2.

The current iLD2 supplied to the second pseudo laser diode LD2 is the same as the current iLD1 supplied to the first pseudo laser diode LD1, and the current iLD1 supplied to the first pseudo laser diode LD1 is proportional to the current i1 output from the current source 2 by the first current mirror circuit 3, and therefore the current iLD supplied to the laser diode LD becomes proportional to the current i1 output from the current source 2.

Figure 7:
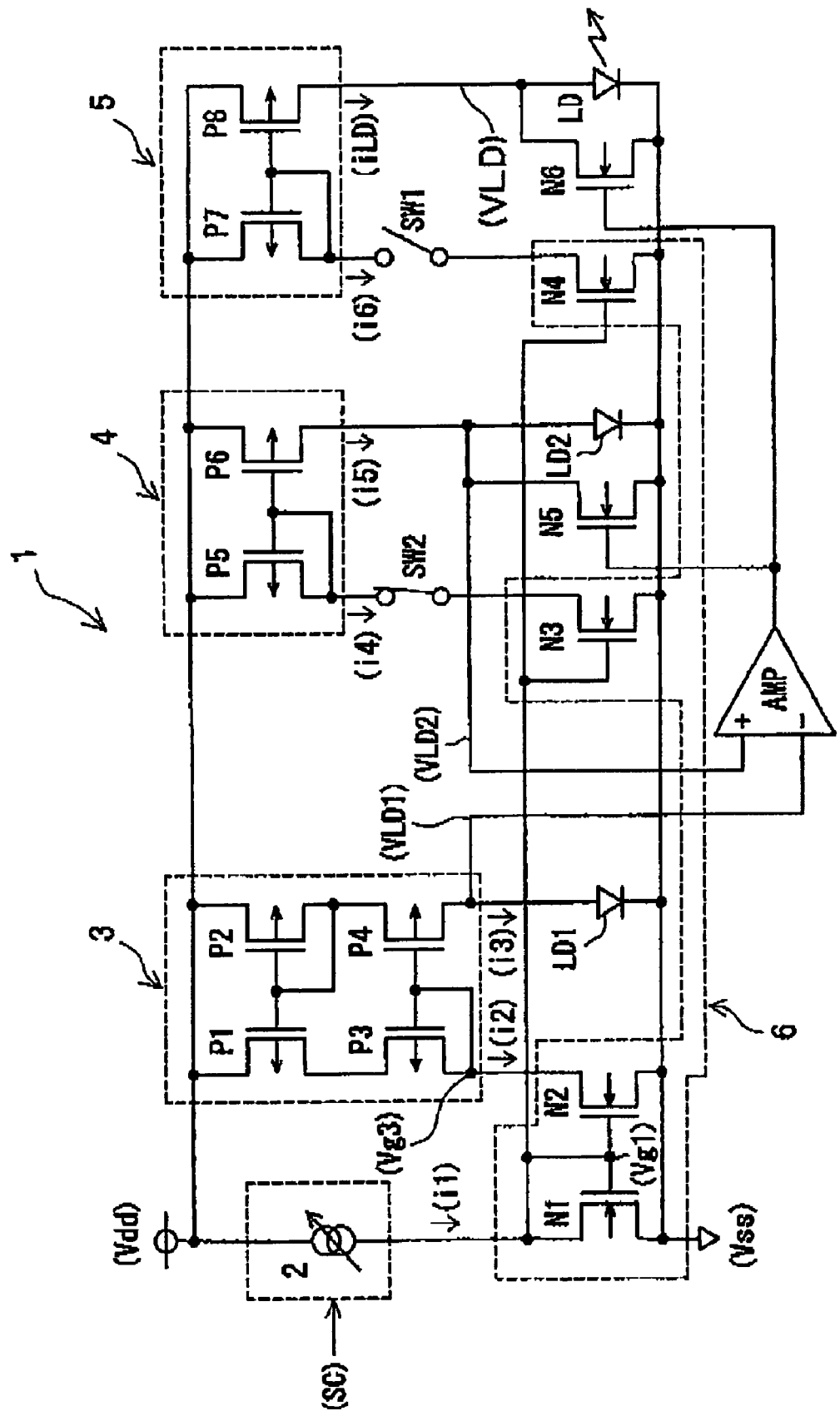
FIG. 7 is another example circuit diagram of a laser diode driving circuit according to the first embodiment of the present invention.

In FIG. 1, the operational amplifier circuit AMP and the NMOS transistor N5 and N6 are used to adjust the input currents to the second and the third current mirror circuits. However, the operational amplifier circuit AMP and the NMOS transistor N5 and N6 can be used to adjust the currents supplied to the second pseudo laser diode LD2 and the laser diode LD. An example of a laser diode driving circuit like this is shown in FIG. 7. In FIG. 7, parts which are the same as or similar to those in the FIG. 1 are assigned the same reference numerals and their explanation is omitted. Only different points from FIG. 1 are explained below.

FIG. 7 is different from FIG. 1 in that the voltage VLD1 is input to the inverting input terminal of the operational amplifier circuit AMP, the voltage VLD2 is input to the non-inverting terminal of the operational amplifier circuit AMP, the NMOS transistor N5 is connected to the second pseudo laser diode LD2 in parallel, the NMOS transistor N6 is connected the laser diode LD in parallel, the device size of the NMOS transistor N2 is the same as or a little bit smaller than the device size of the NMOS transistor N3, and the drain current i2 of the NMOS transistor N2 is smaller than the drain current i4 of the NMOS transistor N3.

In FIG. 7, the drain current i2 of the NMOS transistor N2 is made smaller than the drain current i4 of the NMOS transistor N3, and therefore the current iLD2 flowing through the second pseudo laser diode LD2 becomes larger than the current iLD1 flowing through the first pseudo laser diode LD1. Accordingly, instead of adding currents to the input terminals of the second current mirror circuit 4 and the third current mirror circuit 5, excessive currents are removed or subtracted from the output terminals of the second current mirror circuit 4 and the third current mirror circuit 5 so as to make the current supplied to the laser diode LD proportional to the current i1 drawn from the current source 2.

In this manner, in the laser diode driving circuit according to the first embodiment of the present invention, the fourth current mirror circuit 6 supplies currents in accordance with the current i1 output from the current source 2 to the first through third current mirror circuits 3-5. And the highly precise first current mirror circuit 3 and the first pseudo laser diode LD1 generate the forward voltage VLD1 in accordance with the current i1, on which the laser diode LD is based. The second current mirror circuit 4 and the second pseudo laser diode LD2 generate the actual forward voltage VLD2 for the laser diode LD in accordance with the current i1, to control the current iLD flowing through the laser diode LD so that the forward voltage VLDS becomes the reference forward voltage VLD1. Therefore, it becomes possible to correct the difference due to supply power variation and the channel length modulation effect between the target current value and the actual current value supplied to the laser diode. Current close to the target value can be supplied to the laser diode LD.

Second Embodiment

The highly precise first current mirror circuit 3 is used in the first embodiment. In a second embodiment, the first current mirror circuit 3 is eliminated, and the current i1 from the current source 2 is supplied to the first pseudo laser diode LD1.

Figure 8:
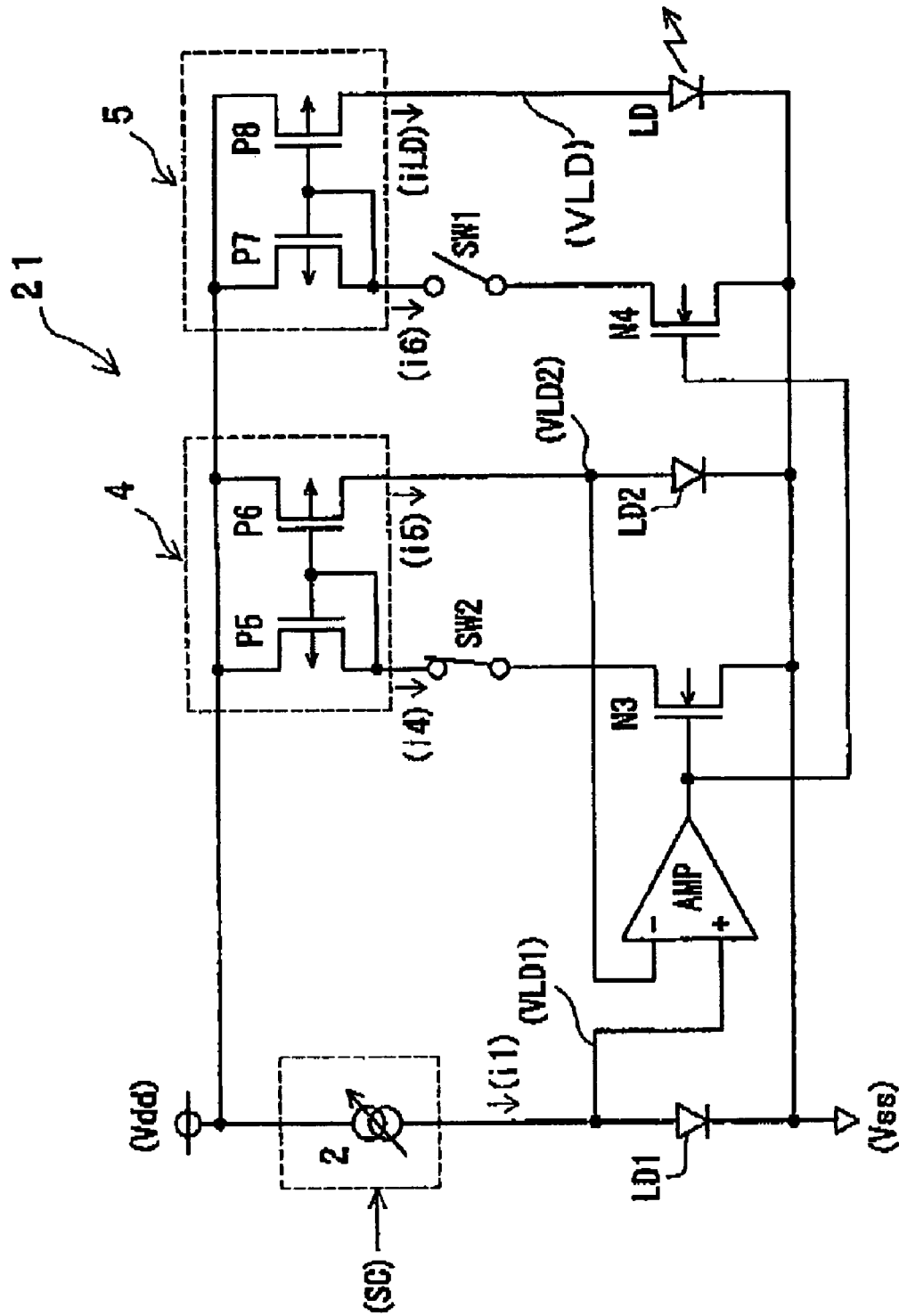
FIG. 8 is an example circuit diagram of a laser diode driving circuit according to a second embodiment of the present invention.

FIG. 8 shows an example of a laser diode driving circuit according to the second embodiment of the present invention. In FIG. 8, parts which are the same as or similar to those in FIG. 1 are assigned the same reference numerals, and their explanation is omitted.

In FIG. 8, a laser diode driving circuit 21 includes a current source 2, a laser diode LD, a first pseudo laser diode LD1, a second pseudo laser diode LD2, a second current mirror circuit 4, a third current mirror circuit 5, NMOS transistors N3 and N4, an operational amplifier circuit AMP for controlling the operation of the NMOS transistors N3 and N4, and first and second switches SW1, SW2. The first pseudo laser diode LD1, the second pseudo laser diode LD2, the second current mirror circuit 4, the third current mirror circuit 5, the NMOS transistors N3 and N4, the operational amplifier circuit AMP, and the first and second switches SW1, SW2 constitute correction circuitry. And the NMOS transistor N3, N4 and the operational amplifier circuit AMP constitute a correction circuit. The NMOS transistor N3 is an example of the first transistor, and the NMOS transistor N4 is an example of the second transistor.

Between a positive power supply Vdd and a negative power supply Vss, the current source 2 and the first pseudo laser diode LD1 are serially connected. A node between the current source 2 and an anode of the first pseudo laser diode LD1 is connected a non-inverting input terminal of the operational amplifier circuit AMP.

In the second current mirror circuit 4, sources of PMOS transistors P5 and P6 are connected to the positive power supply Vdd, and their gates are connected together and the connecting node is connected to a drain of the PMOS transistor P5.

Between the drain of the PMOS transistor P5 and the negative power supply Vss, a switch SW2 and NMOS transistor N3 are serially connected. The gate of the NMOS transistor N3 is connected to an output terminal of the operational amplifier circuit AMP. Between the drain of the PMOS transistor P6 and the negative power supply Vss, the second pseudo laser diode LD2 is connected. A node between a node of the second pseudo laser diode transistor LD2 and the drain of the PMOS transistor P6 is connected to the operational amplifier circuit AMP.

In the third current mirror circuit 5, sources of PMOS transistors P7 and PB are connected to the positive power supply Vdd, and their gates are connected together and the connecting node is connected to the drain of the PMOS transistor P7. Between the drain of the PMOS transistor P7 and the negative power supply Vss, a switch SW1 and an NMOS transistor N4 are serially connected. A gate of the NMOS transistor N4 is connected to the output terminal of the operational amplifier circuit AMP. Between a drain of the PMOS transistor PB and the negative power supply Vss, the laser diode LD is connected.

In this structure, a current i1 output from the current source 2 in accordance with a control signal SC is supplied to the first pseudo laser diode LD1. An anode forward voltage VLD1 of the first pseudo laser diode LD1 is input to a non-inverting input of the operational amplifier circuit AMP.

An anode forward voltage VLD2 of the second pseudo laser diode LD2 is input to the inverting input of the operational amplifier circuit AMP. Accordingly, the operational amplifier circuit AMP controls the gate voltage of the NMOS transistor N3 to supply an adequate current to the second pseudo laser diode LD2 so that the anode voltage VLD2 of the second pseudo laser diode LD2 becomes the same as the anode voltage VLD1 of the first pseudo laser diode LD1.

The second current mirror circuit 4 is in a feedback loop of the operational amplifier circuit AMP, and therefore current asymmetry generated by the second current mirror circuit 4 due to the channel length modulation effect is corrected, and the current iLD2 flowing through the second pseudo laser diode LD2 becomes precisely proportional to the current i1 output from the current source 2.

Because currents flowing in the second current mirror circuit 4 and the third current mirror circuit 5 are made completely proportional to each other, a current flowing through the laser diode LD becomes proportional to a current flowing through the second pseudo laser diode LD2. That is, the current flowing through the laser diode LD is proportional to the current i1 output from the current source 2. The first and second switches SW1 and SW2 are the same as in the first embodiment, and therefore their explanation is omitted.

In this way, in the laser diode driving circuit according to the second embodiment of the present invention, the same advantage as in the first embodiment is attained. Both addition and subtraction can be performed against the current flowing through the laser diode LD. The highly precise current mirror circuit and the fourth current mirror circuit 6 formed by the NMOS transistor N1 and NMOS transistor N2 can be eliminated and the current asymmetry generated in these current mirror circuits due to channel length modulation effect can be improved.

Third Embodiment

The operational amplifier circuit AMP is used in the second embodiment. Without using the operational amplifier circuit AMP and the first current mirror circuit 3, the current i1 from the current source 2 can be supplied to the first pseudo laser diode LD1 in a third embodiment.

Figure 9:
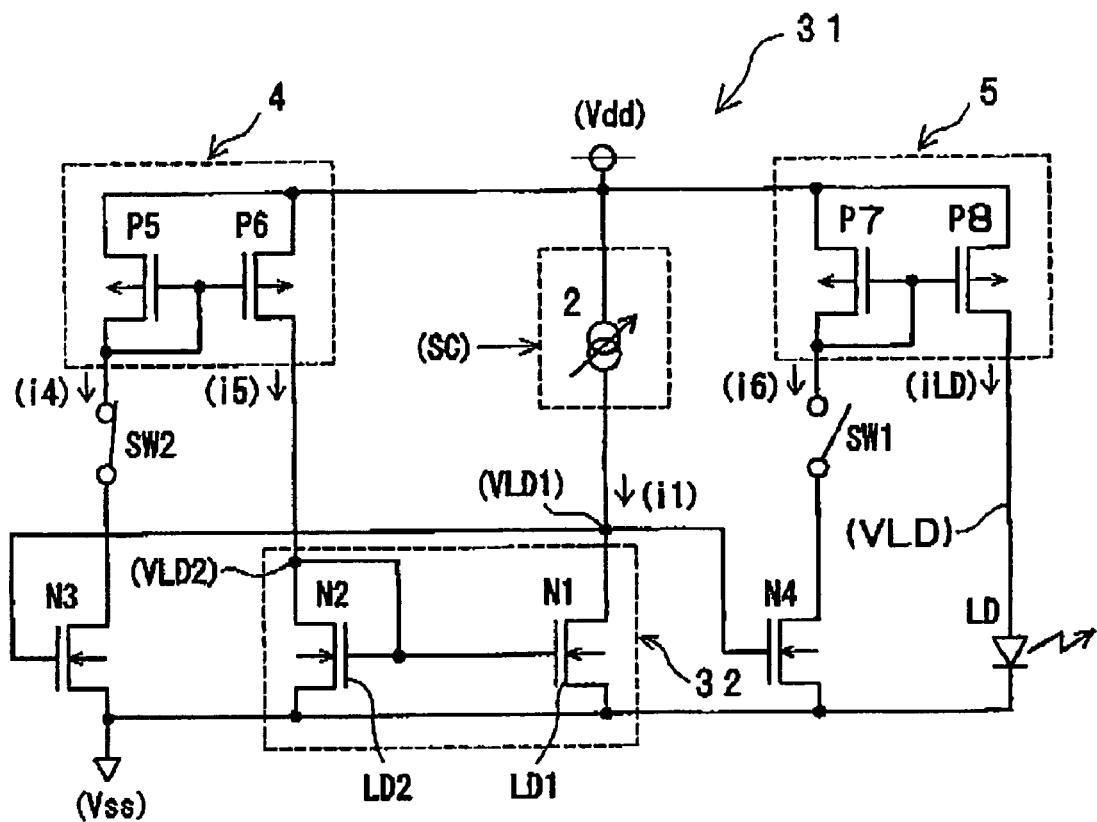
FIG. 9 is an example circuit diagram of a laser diode driving circuit according to a third embodiment of the present invention.

FIG. 9 shows an example of a laser diode driving circuit according to the third embodiment of the present invention. In FIG. 9, parts which are the same as or similar to those in FIG. 1 are assigned the same reference numerals, and their explanation is omitted.

A laser diode driving circuit 31 shown in FIG. 9 includes a current source 2, a laser diode LD, a second current mirror circuit 4, a third current mirror circuit 5, a fourth current mirror circuit 32 formed by NMOS transistors N1 and N2, NMOS transistors N3 and N4, and first and second switches SW1 and SW2. The second current mirror circuit 4, the third current mirror circuit 5, the fourth current mirror circuit 32, the NMOS transistors N3 and N4, the first and second switches SW1 and SW2 constitute correction circuitry. The NMOS transistor N3 and N4 constitute a current supplying circuit. The NMOS transistor N3 is an example of the first MOS transistor, and the NMOS transistor N4 is the second MOS transistor.

Between a positive power supply Vdd and a negative power supply Vss, a current source 2 and an NMOS transistor N1 are serially connected. A node between the current source 2 and the NMOS transistor N1 is connected to gates of NMOS transistors N3 and N4. In the second current mirror circuit 4, sources of PMOS transistors P5 and P6 are connected to the positive power supply Vdd, their gates are connected together, and the connecting node is connected to a drain of the PMOS transistor P5. Between the drain of the PMOS transistor P5 and the negative power supply Vss, a switch SW2 and an NMOS transistor N3 are serially connected.

In the third current mirror circuit 5, sources of PMOS transistors P7 and P8 are connected to the positive power supply Vdd, their gates are connected together, and the connecting node is connected to a drain of the PMOS transistor P7. Between the drain of the PMOS transistor P7 and the negative power supply Vss, a switch SW1 and an NMOS transistor N4 are serially connected.

In the fourth current mirror circuit 32, sources of NMOS transistors N1 and N2 are connected to the negative power supply Vss, their gates are connected together and the connecting node is connected to the drain of the NMOS transistor N2. The NMOS transistor N1 receives the current i1 from the current source 2 at its drain, and functions as a first pseudo laser diode LD1. The NMOS transistor N2 receives a current i5 from the NMOS transistor P6, and functions as the second pseudo laser diode LD2.

In this structure, the current i1 output from the current source 2 in accordance with the control signal SC becomes a drain current for the NMOS transistor N1 functioning as the first pseudo laser diode LD1. The drain voltage of the NMOS transistor N1 becomes an anode forward voltage VLD1 of the first pseudo laser diode LD1, and the voltage VLD1 is input to a gate of the NMOS transistor N3 connected to an input terminal of the second current mirror circuit 4, to make a feedback loop. Therefore the drain current i5 of the NMOS transistor N2 becomes equal to the current i1. As a result, the drain voltage VLD1 of the NMOS transistor N1 becomes a gate voltage of the NMOS transistor N3 so that the output current i5 of the PMOS transistor P6 in the second current mirror circuit 4 becomes substantially equal to the current i1.

Further, the drain voltage VLD1 of the NMOS transistor N1 is input also to the input terminal of the third current mirror circuit 5, and therefore the drain current i6 of the NMOS transistor N4 becomes proportional to the drain current i4 of the NMOS transistor N3.

Because the second current mirror circuit 4 and the third current mirror circuit 5 have the same circuit structure, the drain current i5 of the PMOS transistor P6 becomes proportional to the drain current iLD of the PMOS transistor P8. That is, the drain current iLD of the PMOS transistor P8 is a current flowing through the laser diode LD, and therefore a current flowing through the laser diode LD becomes proportional to the current i1 output from the current source 2.

Because the drain voltage VLD1 of the NMOS transistor N1 does not coincide with the drain voltage VLD2 of the NMOS transistor N2, the fourth current mirror circuit 32 may generate a small error due to the channel length modulation effect. Accordingly, if better characteristics are desired, it is better to make the gate channel lengths of the NMOS transistors N1 and N2 longer, or use a cascade type current mirror circuit in which NMOS transistors are cascade-connected as shown in FIG. 10, or use a highly precise current mirror circuit such as Wilson-type current mirror circuit as shown in FIG. 11.

Figure 10:
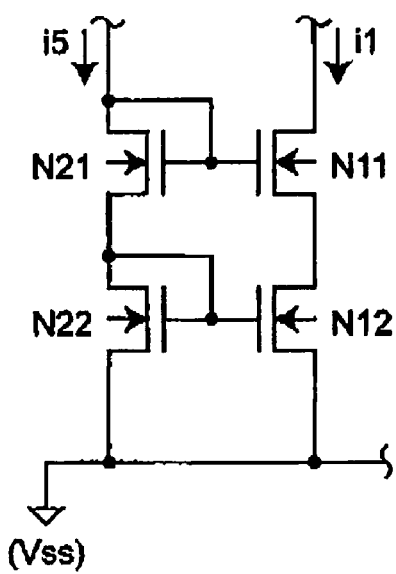
FIG. 10 shows another example of the fourth current mirror circuit 32 shown in FIG. 9.
Figure 11:
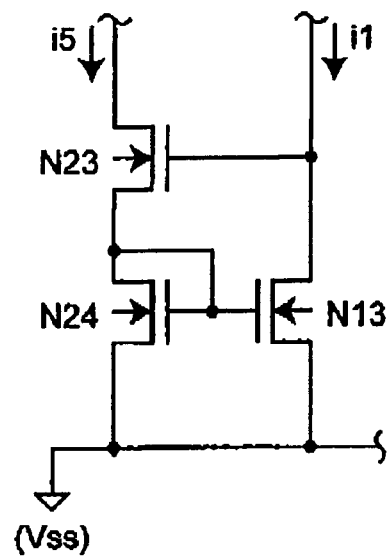
FIG. 11 shows further example of the fourth current mirror circuit 32 shown in FIG. 9.
Figure 12:
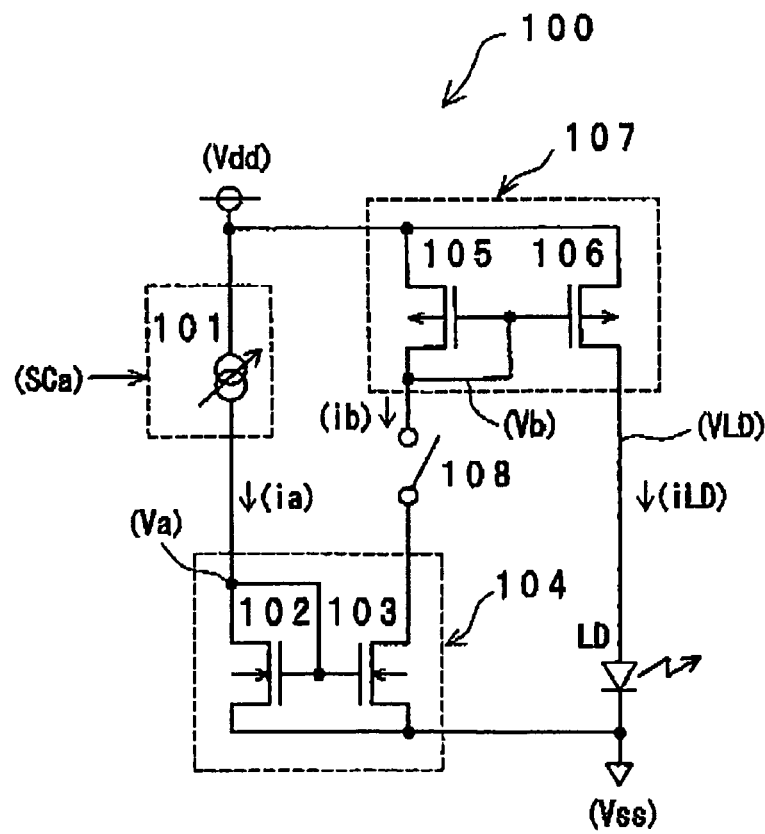
FIG. 12 is a circuit diagram of a prior art laser diode driving circuit.
Figure 13:
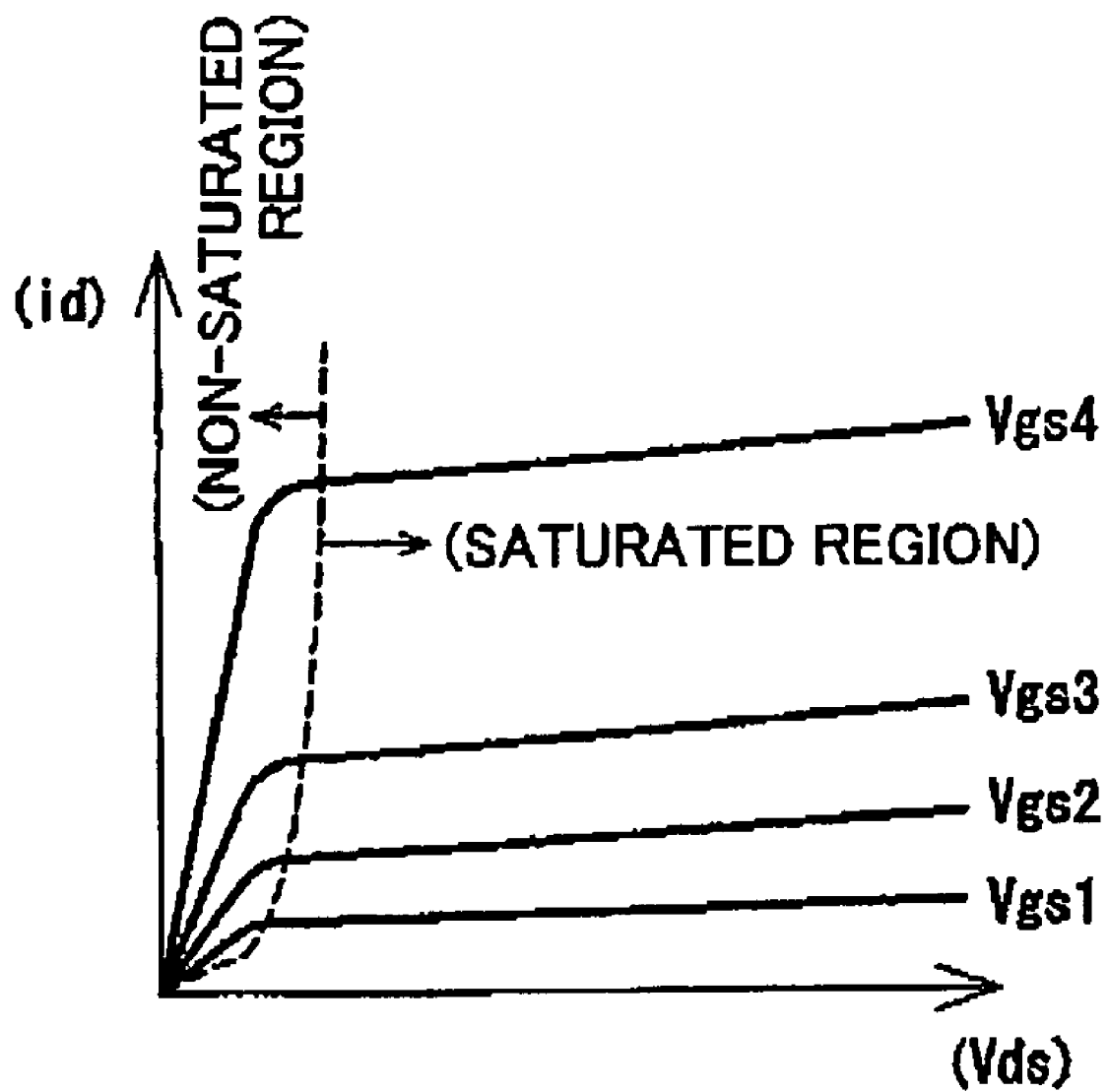
FIG. 13 is a graph illustrating characteristics of drain current id and drain voltage Vds of an NMOS transistor.
Figure 14:
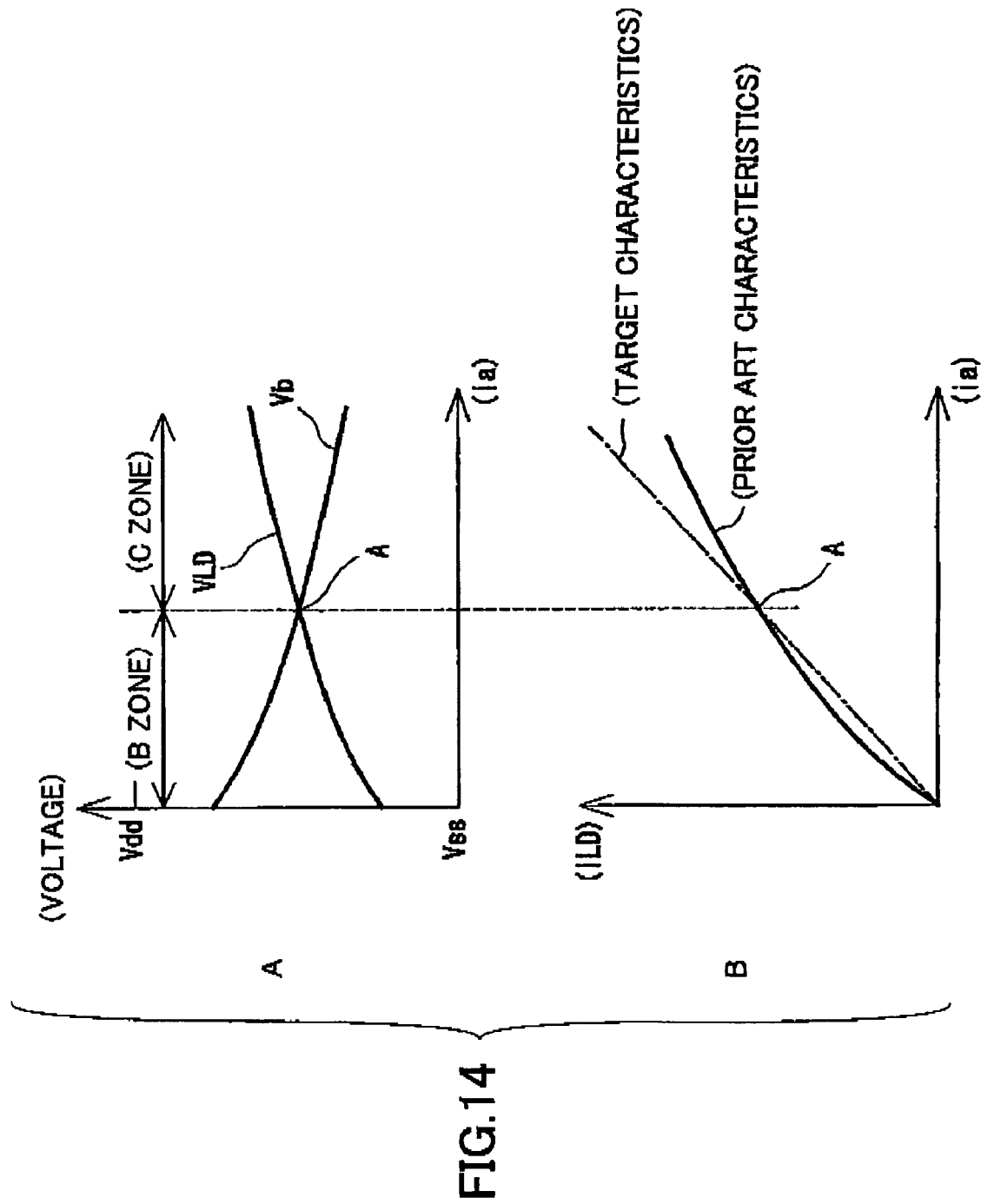
FIG. 14 is a graph illustrating relationships between voltages and current iLD flowing through a laser diode LD, with respect to various currents ia.
Figure 15:
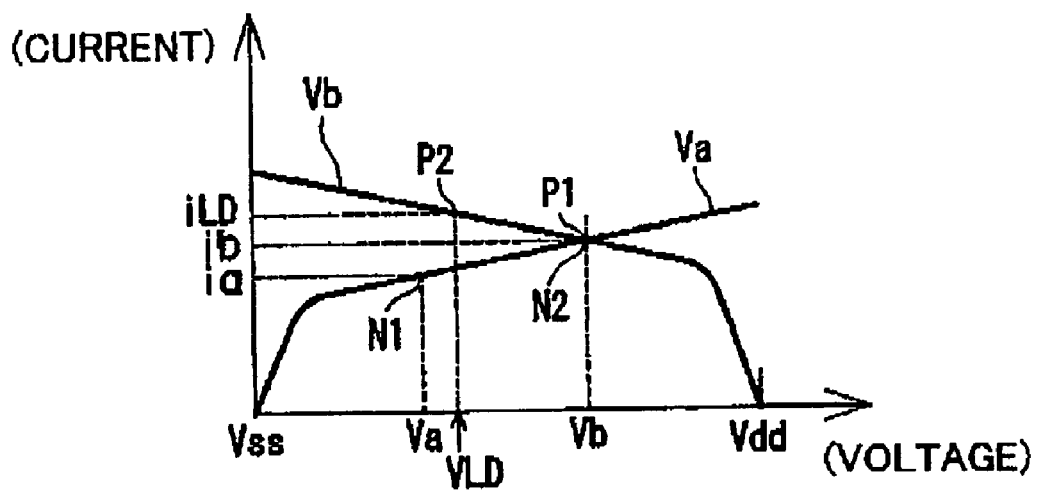
FIG. 15 is a graph illustrating relationships between voltages and currents at various points in FIG. 12 in the B zone shown in FIG. 14.
Figure 16:
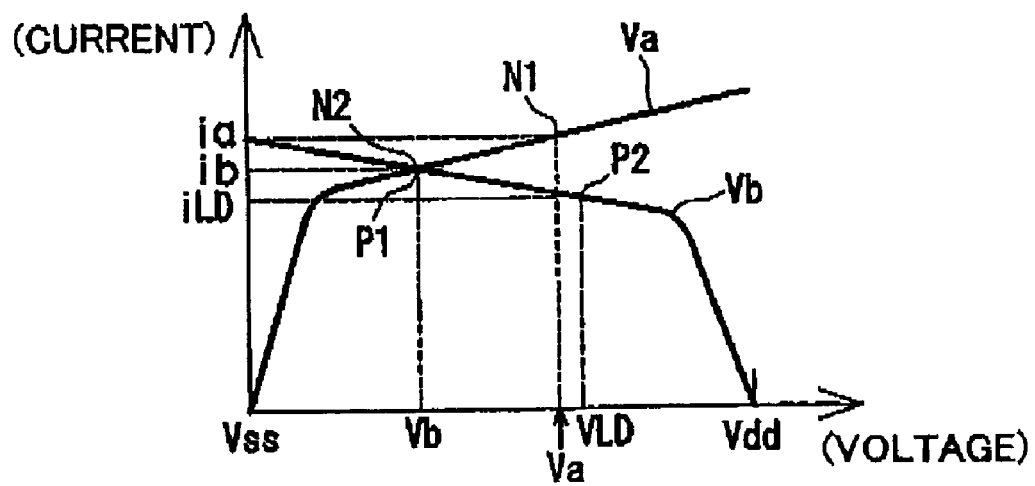
FIG. 16 is a graph illustrating relationships between voltages and currents at various points in FIG. 12 in the C zone shown in FIG. 14.

In the FIG. 10 embodiment, a serial circuit of the NMOS transistors N11 and N12 functions as the first pseudo laser diode LD1, and a serial circuit of the NMOS transistors N21 and N22 functions as the second pseudo laser diode LD2. In the FIG. 11 embodiment, the NMOS transistor N13 functions as a pseudo laser diode LD1, and a serial circuit of the NMOS transistor N13 functions as the first pseudo laser diode LD1; a serial circuit of the NMOS transistors N23 and N24 functions as the second pseudo laser diode LD2.

In this manner, the laser diode driving circuit according to the third embodiment of the present invention has the same advantages as in the second embodiment, and the operational amplifier circuit AMP requiring a comparatively large area on an IC chip can be eliminated to drastically reduce the area needed on an IC chip.

The PMOS transistors used in the first, the second and the third embodiments can be NMOS transistors, and the MMOS transistors used in the first, the second and the third embodiments can be PMOS transistors.

Further, the present invention is not limited to these embodiments, but various variations and modifications may be made without departing from the scope of the present invention.

In laser diode driving circuits according to the embodiments of the present invention, a laser diode can be driven with accurate target currents over a wide range from small current to large current, by adding correction circuitry. The correction circuitry can cancel the channel length modulation effect, and therefore fluctuation of the driving currents for the laser diode can be suppressed even if a power supply voltage is varied.

Target currents can be precisely supplied to a laser diode because currents proportional to the target currents are supplied to a pseudo laser diode whose characteristics are proportional to that of the laser diode.

Further, cost for manufacturing IC chips can be reduced because of simple circuitry.

Because a second switch for a second pseudo laser diode is incorporated in addition to a first switch for controlling on and off of the laser diode, a ratio of currents supplied to the second pseudo laser diode and the laser diode can be accurately controlled to supply the target currents to the laser diode precisely.

The present application is based on Japanese Priority Application No. 2003-331328 filed on Sep. 24, 2003, with the Japanese Patent Office, the entire contents of which are hereby incorporated by reference.

What is claimed is:

1. A laser diode driving circuit for causing a laser diode to emit light by varying a current value of a current source in accordance with a control signal input externally and supplying a current that is the same as or proportional to the current value to the laser diode, comprising:
   correction circuitry for generating a reference forward voltage as a reference for the laser diode in accordance with a predetermined driving current for driving the laser diode;
   generating a forward voltage for the laser diode in accordance with the predetermined driving current; and
   correcting a current supplied to the laser diode so that the forward voltage becomes the same as the reference forward voltage,
   wherein the correction circuitry includes:
   first and second pseudo laser diodes having current-voltage characteristics that are the same as or proportional to that of the laser diode;
   a first current mirror circuit for generating a current in accordance with an input current and supplying the generated current to the first pseudo laser diode;
   a second current mirror circuit for generating a current in accordance with an input current and supplying the generated current to the second pseudo laser diode;
   a third current mirror circuit for generating a current in accordance with an input current and supplying the generated current to the laser diode;
   a fourth current mirror circuit for outputting a current in accordance with the current value to each of the first, the second and the third current mirror circuits; and
   a correction circuit for adding a current to an input terminal of each of the first and the second current mirror circuits so that a forward voltage of the first pseudo laser diode becomes the same as a forward voltage of the second pseudo laser diode;
   wherein the second current mirror circuit has the same circuit structure as the third current mirror circuit; a consumption current of the second current mirror circuit is proportional to a consumption current of the third current mirror circuit; and the correction circuit adds a current to an input terminal of the third current mirror circuit, said current added to the third current mirror circuit input terminal being proportional to the current added to the second current mirror circuit input terminal.

2. The laser diode driving circuit as claimed in claim 1, wherein the first and the second pseudo laser diodes have the same current-voltage characteristics; the current of the first current mirror circuit is larger than the current of the second current mirror circuit; and the correction circuit adds currents to the input terminals of the first and second current mirror circuits so that a difference between the current supplied to the first pseudo laser diode and the current supplied to the second pseudo laser diode becomes zero.

3. The laser diode driving circuit as claimed in claim 1, wherein the correction circuit makes a correction so that a ratio of the current added to the second current mirror circuit input terminal over the current added to the third current mirror circuit input terminal equals to a ratio of a consumption current of the second current mirror circuit over a consumption current of the third current mirror circuit.

4. The laser diode driving circuit as claimed in claim 1, wherein the correction circuit includes:
   an operational amplifier circuit having first and second input terminals, the first input terminal being connected to a node between an output terminal of the first current mirror circuit and the first pseudo laser diode, and the second input terminal being connected to a node between an output terminal of the second current mirror circuit and the second pseudo laser diode;
   a first transistor for supplying a current in accordance with an output signal of the operational amplifier circuit, to the second current mirror circuit input terminal; and
   a second transistor for supplying a current in accordance with the output signal of the operational amplifier circuit, to the third current mirror circuit input terminal.

5. The laser diode driving circuit as claimed in claim 1, wherein the first current mirror circuit is formed by a highly precise current mirror circuit that generates and outputs an output current precisely proportional to an input current.

6. The laser diode driving circuit as claimed in claim 5, wherein the first current mirror circuit is formed by a stacked type current mirror circuit.

7. The laser diode driving circuit as claimed in claim 5, wherein the first current mirror circuit is formed by two current mirror circuits that are cascade-connected.

8. The laser diode driving circuit as claimed in claim 5, wherein the first current mirror circuit is formed by Wilson-type current mirror circuit.

9. The laser diode driving circuit as claimed in claim 1, wherein a current ratio of current-voltage characteristics of the laser diode and the second pseudo laser diode is equal to a ratio of a consumption current of the third current mirror circuit and a consumption current of the second current mirror circuit.

10. The laser diode driving circuit as claimed in claim 1, wherein each of the first and second pseudo laser diodes is formed by a MOS transistor whose gate and drain are connected together.

11. The laser diode driving circuit as claimed in claim 1, wherein each of the first and second pseudo laser diodes is formed by serially connected MOS transistors whose gate and drain are connected together.

12. The laser diode driving circuit as claimed in claim 1, wherein each of the first and second pseudo laser diodes is formed by a constant voltage power supply and a resistor.

13. The laser diode driving circuit as claimed in claim 1, wherein the correction circuitry comprises:
  a first switch for switching in response to the control signal input externally, and controlling current supply to the third current mirror circuit input terminal; and
  a second switch for switching in response to the control signal input externally, and controlling current supply to the second current mirror circuit input terminal.

14. The laser diode driving circuit as claimed in claim 13, wherein:
  a ratio of an impedance of the first switch under a conducting condition and an impedance of the second switch under the conducting condition is equal to the inverse of a ratio of a consumption current of the third current mirror circuit and a consumption current of the second current mirror circuit.

15. A laser diode driving circuit for causing a laser diode to emit light by varying a current value of a current source in accordance with a control signal input externally and supplying a current that is the same as or proportional to the current value to the laser diode, comprising:
  correction circuitry for generating a reference forward voltage as a reference for the laser diode in accordance with a predetermined driving current for driving the laser diode;
  generating a forward voltage for the laser diode in accordance with the predetermined driving current; and
  correcting a current supplied to the laser diode so that the forward voltage becomes the same as the reference forward voltage, wherein the correction circuitry includes:
  a first pseudo laser diode having current-voltage characteristics that are the same as or proportional to that of the laser diode, the current from the current source being supplied to the first pseudo laser diode;
  a second pseudo laser diode having current-voltage characteristics that are the same as or proportional to that of the laser diode;
  a second current mirror circuit for generating a current in accordance with an input current and supplying the generated current to the second pseudo laser diode;
  a third current mirror circuit for generating a current in accordance with an input current and supplying the generated current to the laser diode; and
  a correction circuit for adding a current to an input terminal of each of the second and the third current mirror circuits so that a forward voltage of the first pseudo laser diode becomes the same as a forward voltage of the second pseudo laser diode;
  wherein the second current mirror circuit has the same circuit structure as the third current mirror circuit; and a consumption current of the second current mirror circuit is proportional to a consumption current of the third current mirror circuit.

16. The laser diode driving circuit as claimed in claim 15, wherein the correction circuit makes a correction so that a ratio of the current supplied to the second current mirror circuit input terminal over the current supplied to the third current mirror circuit input terminal equals to a ratio of a consumption current of the second current mirror circuit over a consumption current of the third current mirror circuit.

17. The laser diode driving circuit as claimed in claim 15, wherein the correction circuit includes: an operational amplifier circuit having first and second input terminals, the first input terminal being connected to a node between the current source and the first pseudo laser diode, and the second input terminal being connected to a node between an output terminal of the second current mirror circuit and the second pseudo laser diode;
  a first transistor for supplying a current in accordance with an output signal of the operational amplifier circuit, to the second current mirror circuit input terminal; and
  a second transistor for supplying a current in accordance with the output signal of the operational amplifier circuit, to the third current mirror circuit input terminal.

18. The laser diode driving circuit as claimed in claim 15, wherein the first and the second pseudo laser diodes have the same current-voltage characteristics.

19. A laser diode driving circuit for causing a laser diode to emit light by varying a current value of a current source in accordance with a control signal input externally and supplying a current that is the same as or proportional to the current value to the laser diode, comprising:
  correction circuitry for generating a reference forward voltage as a reference for the laser diode in accordance with a predetermined driving current for driving the laser diode;
  generating a forward voltage for the laser diode in accordance with the predetermined driving current; and
  correcting a current supplied to the laser diode so that the forward voltage becomes the same as the reference forward voltage, wherein the correction circuitry includes:
  a first pseudo laser diode having current-voltage characteristics that are the same as or proportional to that of the laser diode, the current from the current source being supplied to the first pseudo laser diode;
  a second pseudo laser diode having current-voltage characteristics that are the same as or proportional to that of the laser diode;
  a second current mirror circuit for generating a current in accordance with an input current and supplying the generated current to the second pseudo laser diode;
  a third current mirror circuit for generating a current in accordance with an input current and supplying the generated current to the laser diode; and
  a current supplying circuit for supplying a current in accordance with a voltage at a node between the current source and the first pseudo laser diode, to input terminals of the second and third current mirror circuits;
  wherein the first and second pseudo laser diodes constitute a fourth current mirror circuit in which the first pseudo laser diode forms an output side transistor and the second pseudo laser diode forms an input side transistor; the second current mirror circuit has the same circuit structure as the third current mirror circuit; and a consumption current of the second current mirror circuit is proportional to a consumption current of the third current mirror circuit.

20. The laser diode driving circuit as claimed in claim 19, wherein the current supplying circuit includes:
  a first MOS transistor supplying a current in accordance with a voltage at a node between the current source and the first pseudo laser diode, to the second current mirror circuit input terminal; and
  a second MOS transistor supplying a current in accordance with the voltage at the node between the current source and the first pseudo laser diode, to the third current mirror circuit input terminal;

wherein a ratio of a drain current in drain current-gate voltage characteristics of the first MOS transistor over a drain current in drain current-gate voltage characteristics of the second MOS transistor is a ratio of a consumption current of the second current mirror circuit over a consumption current of the third current mirror circuit.

21. The laser diode driving circuit as claimed in claim 19, wherein:

each of the first and second pseudo laser diodes comprises a MOS transistor; and a current ratio of current-voltage characteristics of the laser diode and drain current-gate voltage characteristics of the MOS transistor forming the second pseudo laser diode is equal to a ratio of a consumption current of the third current mirror circuit and a consumption current of the second current mirror circuit.

\* \* \* \* \*